United States Patent
Fuchi et al.

(10) Patent No.: US 9,062,853 B2
(45) Date of Patent: Jun. 23, 2015

(54) BROADBAND INFRARED LIGHT EMITTING DEVICE

(75) Inventors: Shingo Fuchi, Nagoya (JP); Yoshikazu Takeda, Nagoya (JP)

(73) Assignee: NATIONAL UNIVERSITY CORPORATION NAGOYA UNIVERSITY, Nagoya-Shi, Aichi (JP)

( * ) Notice: Subject to any disclaimer, the term of this patent is extended or adjusted under 35 U.S.C. 154(b) by 0 days.

(21) Appl. No.: 13/809,870

(22) PCT Filed: Jul. 4, 2011

(86) PCT No.: PCT/JP2011/065303
§ 371 (c)(1),
(2), (4) Date: Jan. 11, 2013

(87) PCT Pub. No.: WO2012/008325
PCT Pub. Date: Jan. 19, 2012

(65) Prior Publication Data
US 2013/0119280 A1   May 16, 2013

(30) Foreign Application Priority Data
Jul. 12, 2010   (JP) .................................. 2010-158317

(51) Int. Cl.
F21V 9/16    (2006.01)
C09K 11/77   (2006.01)
H01L 33/50   (2010.01)

(52) U.S. Cl.
CPC ............... *F21V 9/16* (2013.01); *C03B 2201/34* (2013.01); *C03B 2201/30* (2013.01);
(Continued)

(58) Field of Classification Search
CPC .................. H01L 33/502–33/504; F21K 9/56; C03B 2201/28; C03B 2201/30; C03B 2201/34
USPC ......... 250/504 R; 257/98–100; 313/501–504; 65/390
See application file for complete search history.

(56) References Cited

U.S. PATENT DOCUMENTS

2004/0173806 A1*  9/2004  Chua .............................. 257/98
2004/0233514 A1* 11/2004  Takagi et al. .............. 359/341.1
(Continued)

FOREIGN PATENT DOCUMENTS

| JP | 5-58675 A | 3/1993 |
| JP | 2000-230172 A | 8/2000 |

(Continued)

OTHER PUBLICATIONS

International Search Report (ISR) (PCT Form PCT/ISA/210) dated Aug. 2, 2011, in PCT/JP2011/065303.
(Continued)

*Primary Examiner* — Jack Berman
*Assistant Examiner* — Kevin Chung
(74) *Attorney, Agent, or Firm* — McGinn IP Law Group, PLLC

(57) ABSTRACT

[PROBLEM] There is provided a broadband infrared light emitting device that radiates infrared light having a band broader than a conventional broadband infrared light emitting device.
[MEANS FOR SOLVING] The broadband infrared light emitting device at least includes: a light source 4 that emits first excitation light $\lambda 1$ in a first wavelength range; a first glass phosphor 51 that has an excitation band in a first wavelength range, and when the first excitation light $\lambda 1$ is incident thereon, emits second excitation light $\lambda 2$ in a second wavelength range and first infrared light $\lambda 3$ in a third wavelength range; and a second glass phosphor 52 that has an excitation band in the second wavelength range and does not have an excitation band in the third wavelength range, and when the second excitation light $\lambda 2$ is incident thereon, allows the first infrared light $\lambda 3$ to pass therethrough and emits second infrared light $\lambda 4$ in a fourth wavelength range, and the broadband infrared light emitting device radiates broadband infrared light including at least a part of the third wavelength range and at least a part of the fourth wavelength range to an outside of the broadband infrared light.

8 Claims, 13 Drawing Sheets

(52) U.S. Cl.
CPC .......... *C03B 2201/28* (2013.01); *H01L 33/501* (2013.01); *H01L 33/504* (2013.01); *C09K 11/776* (2013.01); *C09K 11/7782* (2013.01); *H01L 2924/0002* (2013.01); *H01L 2224/13* (2013.01); *H01L 2224/48091* (2013.01); *H01L 2224/48247* (2013.01)

(56) References Cited

U.S. PATENT DOCUMENTS

| | | | |
|---|---|---|---|
| 2005/0213197 A1* | 9/2005 | Tsuda | 359/341.5 |
| 2007/0001242 A1* | 1/2007 | Kim et al. | 257/410 |
| 2007/0082575 A1* | 4/2007 | Shin et al. | 445/24 |
| 2008/0231170 A1* | 9/2008 | Masato et al. | 313/501 |
| 2008/0246388 A1* | 10/2008 | Cheon et al. | 313/501 |
| 2009/0134775 A1* | 5/2009 | Watanabe et al. | 313/503 |
| 2010/0029459 A1* | 2/2010 | Zwanziger et al. | 501/42 |
| 2010/0255981 A1 | 10/2010 | Morisada | |
| 2011/0260194 A1 | 10/2011 | Fuchi et al. | |

FOREIGN PATENT DOCUMENTS

| | | |
|---|---|---|
| JP | 2006-32726 A | 2/2006 |
| JP | 2008-21973 A | 1/2008 |
| JP | 2008-185378 A | 8/2008 |
| JP | 2009-143739 A | 7/2009 |
| JP | 2010-98194 A | 4/2010 |
| WO | WO 2010/055831 A1 | 5/2010 |

OTHER PUBLICATIONS

Fuchi, et al., "Wideband Infrared Emission from $Yb^{3+}$-and $Nd^{3+}$-Doped $Bi_2O_3$—$B_2O_3$ Glass Phosphor for an Optical Coherence Tomography Light Source", Japanese Journal of Applied Physics vol. 47, No. 10, 2008, pp. 7932-7935.

Fuchi, et al., "High Power and High Resolution Near-Infrared Light Source for Optical Coherence Tomography Using Glass Phosphor and Light Emitting Diode", Applied Physics Express 2 (2009) pp. 032102-1-032102-3.

Fuchi, et al., Fabrication of OCT light source by $Bi_2O_3$—$B_2O_3$ glass phosphor doped with $Yb^{3+}$ and $Nd^{3+}$, European Journal of Glass Science and Technology Part A, vol. 5, pp. 319-322 (2009).

\* cited by examiner

F I G. 1
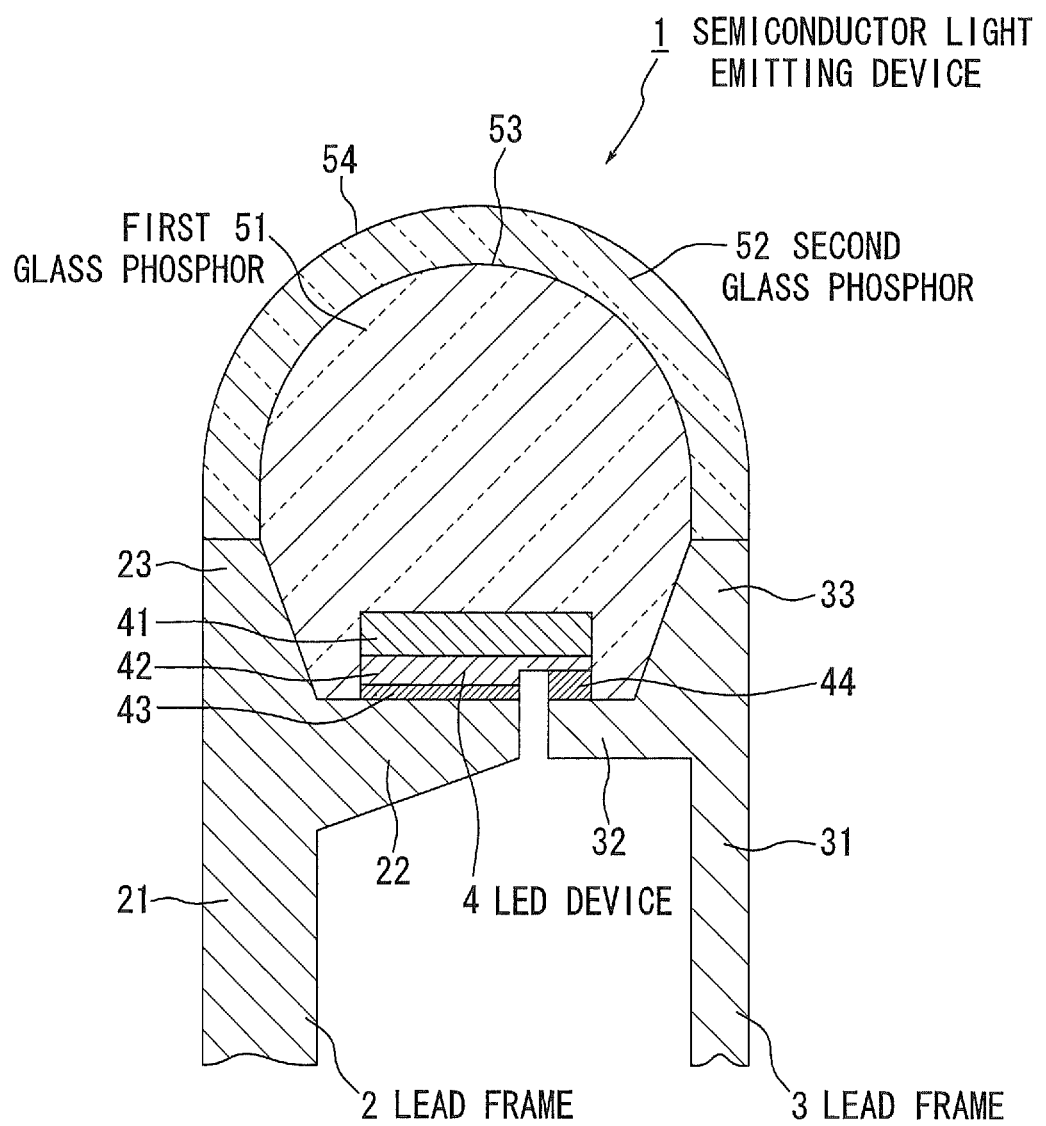

FIG. 3
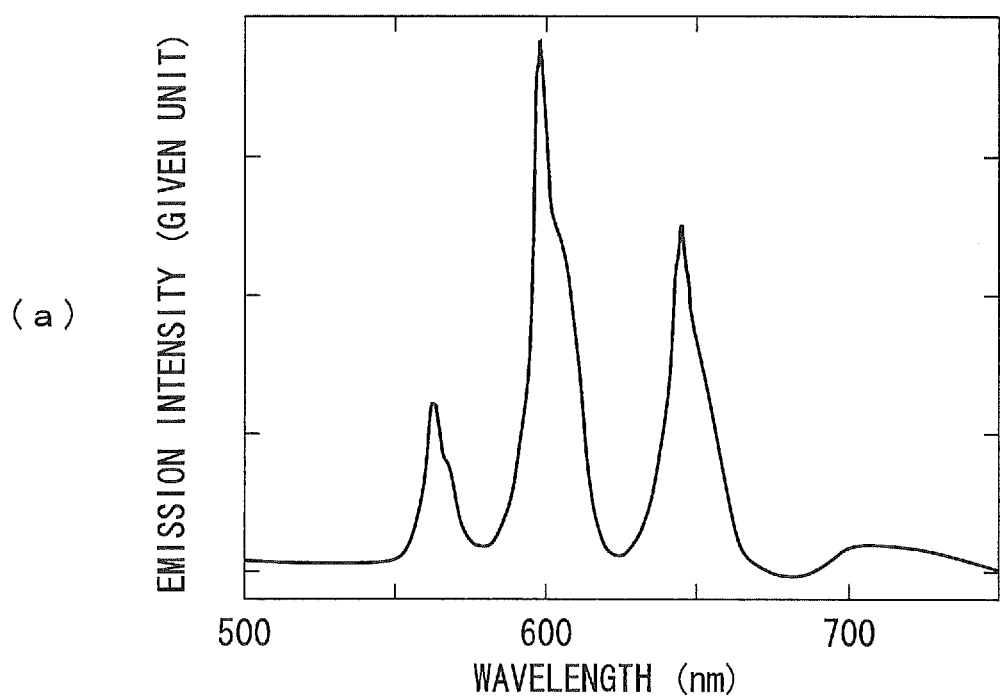
(a)
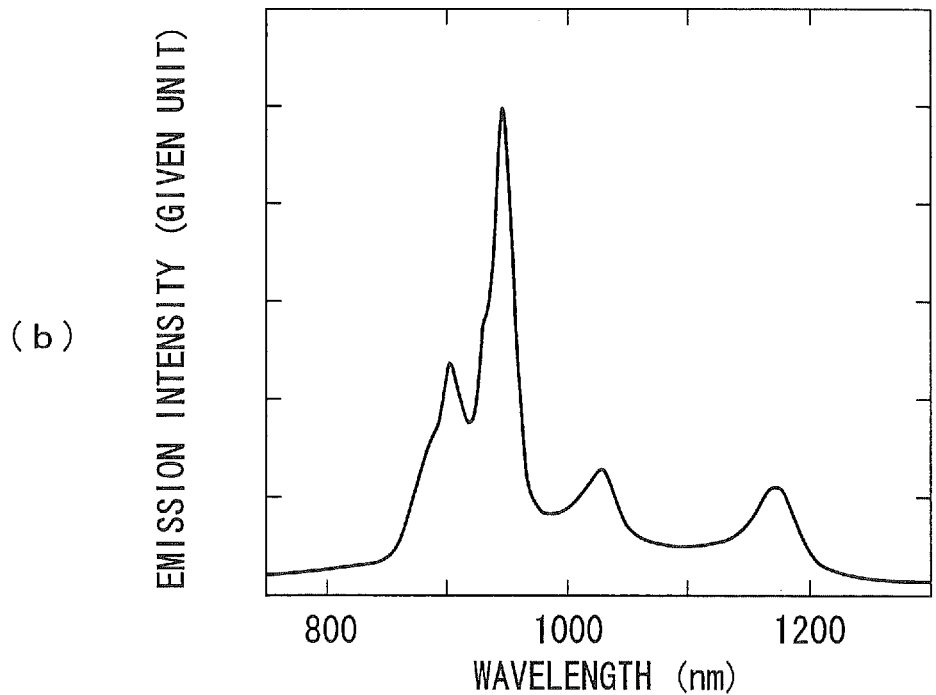
(b)

F I G. 9
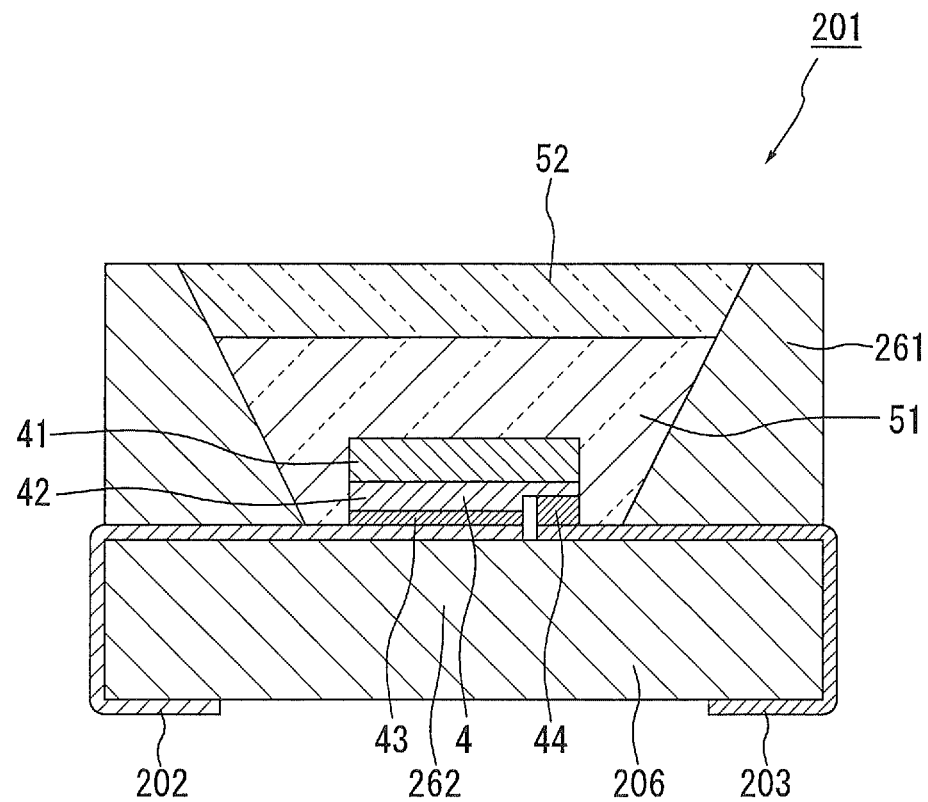

F I G. 1 3
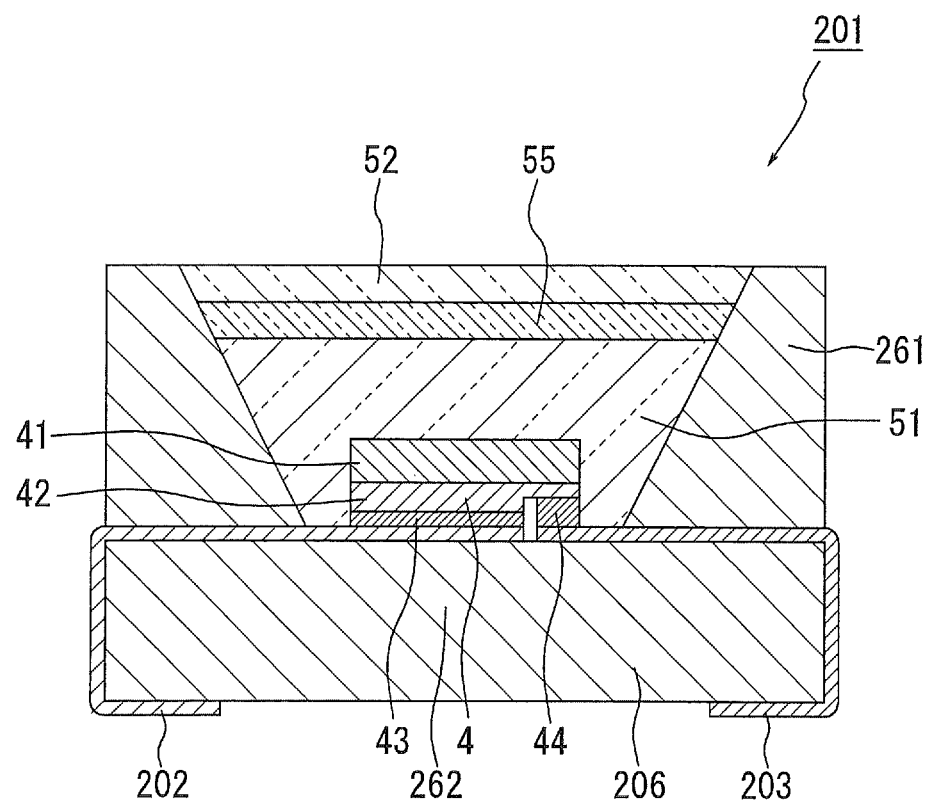

F I G. 1 4
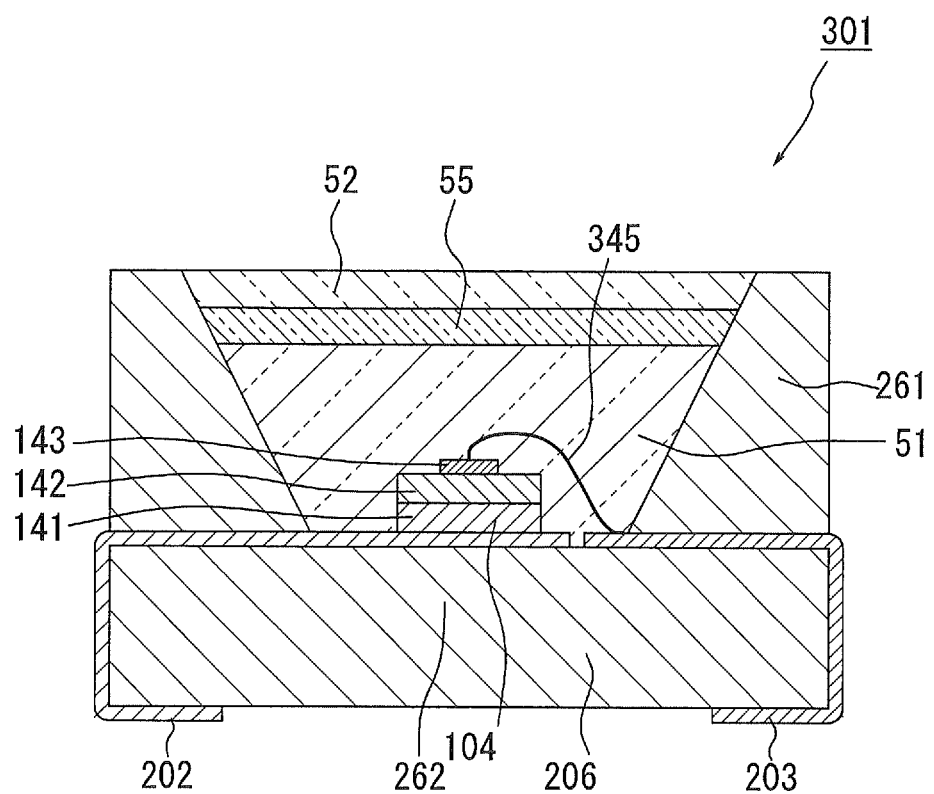

BROADBAND INFRARED LIGHT EMITTING DEVICE

TECHNICAL FIELD

The present invention relates to a broadband infrared light emitting device.

BACKGROUND ART

Conventionally, broadband light sources are used as a light source for a medical device or a spectroscopic analysis. Generally, halogen lamps are used as such a broadband light source, but are disadvantageous in that they are large in size, have a short life span, and are greatly affected by heat rays.

In contrast, LEDs and the like, which are semiconductor light emitting devices, are advantageous in that they are smaller in size and have a longer life span than halogen lamps, and they are capable of emitting light only in a specific wavelength range. The emitted light, however, has a short half width, namely about 50 nm.

In response to this, the present inventors have proposed a light source for an optical coherence tomography device including an infrared glass phosphor and a semiconductor light emitting device (see Patent Literature 1, Non-Patent Literature 1, 2, 3, and the like, for example). In a light source described in Patent Literature 1, the use of an infrared glass phosphor provides infrared light having a relatively long half width, namely 72 nm, 84 nm, and 88 nm.

CITATION LIST

Patent Literature

Patent Literature 1: Japanese Unexamined Patent Application Publication No. 2008-185378

Non-Patent Literature

Non-Patent Literature 1: Japanese Journal of Applied Physics, Vol. 47, pp. 7932-7935 (2008)
Non-Patent Literature 2: Applied Physics Express Vol. 2, Art. No. 032102 (2009)
Non-Patent Literature 3: European Journal of Glass Science and Technology Part A, Vol. 5, pp. 319-322 (2009)

SUMMARY OF INVENTION

Technical Problem

Incidentally, in a light source for an optical coherence tomography device as in Patent Literature 1, the resolution of the depth direction is in inverse proportion to the half width, which requires a light source having a broader band.

Further, also spectroscopic analyses require a light source having a broader band, because it increases the number of substances that can be detected simultaneously. Particularly in a wavelength range of from 900 to 1000 nm, absorption spectra resulting from sugar, fat, water, and the like are present. Thus, this wavelength range is important in agricultural and food fields. The light sources described in Patent Literature 1 and Non-Patent Literature 1 to 3, however, do not fully cover the entirety of the wavelength range.

The present invention is made under the above circumstances, and an object of the present invention is to provide a broadband infrared light emitting device that radiates infrared light having a broader band.

Solution to Problem

To achieve the above object, the present invention provides a broadband infrared light emitting device at least including: a light source that emits first excitation light in a first wavelength range; a first glass phosphor that has an excitation band in the first wavelength range, and if the first excitation light is incident thereon, emits second excitation light in a second wavelength range and first infrared light in a third wavelength range; and a second glass phosphor that has an excitation band in the second wavelength range and does not have an excitation band in the third wavelength range, and if the second excitation light is incident thereon, allows the first infrared light to pass therethrough and emits second infrared light in a fourth wavelength range, wherein the broadband infrared light emitting device radiates broadband infrared light including at least a part of the third wavelength range and at least a part of the fourth wavelength range to an outside of the broadband infrared light.

On the basis of the broadband infrared light emitting device, if first excitation light is emitted from a light source and incident on a first glass phosphor, the first glass phosphor, excited by the first excitation light, emits second excitation light and first infrared light. Further, if the second excitation light and the first infrared light are incident on a second glass phosphor, the first infrared light passes through the second glass phosphor, and the second glass phosphor, excited by the second excitation light, emits second infrared light. This causes the second glass phosphor to radiate broadband infrared light including the first infrared light and the second infrared light to the outside.

In the broadband infrared light emitting device, it is preferable that: the third wavelength range should be shorter than the fourth wavelength range; the first glass phosphor, if the first excitation light is incident thereon, should emit third infrared light in a fifth wavelength range that is longer than the fourth wavelength range; the second glass phosphor should not have an excitation band in the fifth wavelength range; and the broadband infrared light should include at least a part of the third wavelength range, at least a part of the fourth wavelength range, and at least a part of the fifth wavelength range.

On the basis of the broadband infrared light emitting device, if the first excitation light is emitted from the light source and incident on the first glass phosphor, the first glass phosphor, excited by the first excitation light, emits third infrared light in addition to the second excitation light and the first infrared light. Further, if the second excitation light, the first infrared light, and the third infrared light are incident on the second glass phosphor, the first infrared light and the third infrared light pass through the second glass phosphor, and the second glass phosphor, excited by the second excitation light, emits the second infrared light. This causes the second glass phosphor to radiate broadband infrared light including the first infrared light, the second infrared light, and the third infrared light to the outside.

In the broadband infrared light emitting device, an emission center of the first glass phosphor may be an Sm ion; and an emission center of the second glass phosphor may be a Yb ion and an Nd ion.

In broadband infrared light emitting device, the first wavelength range may be from 380 nm to 440 nm; the second wavelength range may be from 550 nm to 670 nm; the third wavelength range may be from 850 nm to 970 nm; the fourth wavelength range may be from 950 nm to 1070 nm; and the fifth wavelength range may be from 1100 nm to 1220 nm.

The broadband infrared light emitting device may further include a third glass phosphor that has an excitation band in a predetermined wavelength range, and if predetermined excitation light is incident thereon, emits fourth infrared light in a sixth wavelength range, wherein the broadband infrared light may include at least a part of the third wavelength range, at least a part of the fourth wavelength range, and at least a part of the sixth wavelength range.

In the broadband infrared light emitting device, the predetermined wavelength range may be at least a part of at least one of the second wavelength range, the third wavelength range, the fourth wavelength range, and the fifth wavelength range.

In the broadband infrared light emitting device, an emission center of the third glass phosphor may be an Er ion.

In the broadband infrared light emitting device, the sixth wavelength range may be from 1450 nm to 1630 nm.

In the broadband infrared light emitting device, the light source may be a semiconductor light emitting device; and the first glass phosphor may seal the semiconductor light emitting device.

In the broadband infrared light emitting device, the second glass phosphor may cover the first glass phosphor.

In the broadband infrared light emitting device, matrices of the first glass phosphor and the second glass phosphor may be glasses of the same system.

In the broadband infrared light emitting device, the matrices of the phosphors may be made of $Sb_2O_3$—$B_2O_3$ glasses.

Advantageous Effects of Invention

On the basis of the broadband infrared light emitting device according to the present invention, it is possible to radiate infrared light having a broader band than a conventional broadband infrared light emitting device.

BRIEF DESCRIPTION OF THE DRAWINGS

FIG. 1 is a schematic cross-sectional view of a semiconductor light emitting device according to a first embodiment of the present invention.

FIGS. 3(a) and (b) are graphs showing emission spectrum of a first glass phosphor having a thickness of 1.0 mm produced such that $Sm_2O_3$ is 1.1 mol %, $Bi_2O_3$ is 9.9 mol %, $B_2O_3$ is 44.6 mol %, and $Sb_2O_3$ is 44.4 mol %: (a) shows a shorter wavelength side; and (b) shows a longer wavelength side.

FIG. 9 is a schematic cross-sectional view of the semiconductor light emitting device, showing a variation.

FIG. 13 is a schematic cross-sectional view of the semiconductor light emitting device, showing a variation.

FIG. 14 is a schematic cross-sectional view of the semiconductor light emitting device, showing a variation.

DESCRIPTION OF EMBODIMENTS

Figure 2:
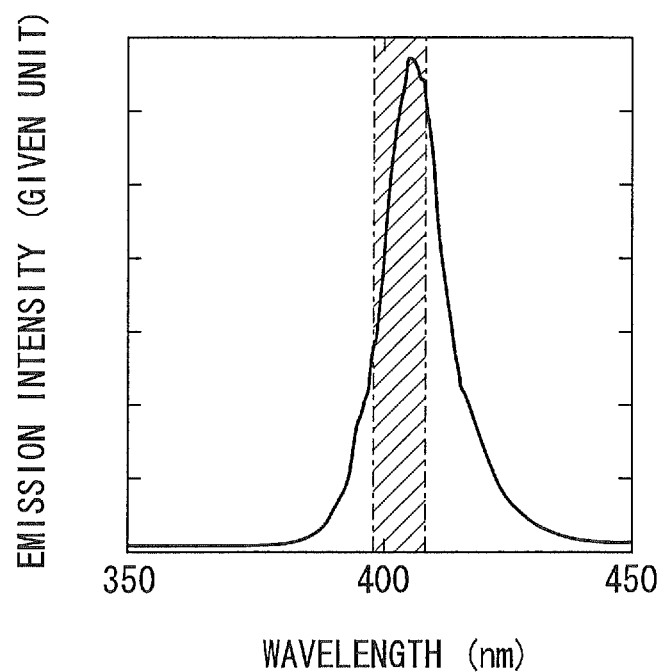
FIG. 2 is a graph showing emission spectrum of an LED device.

FIGS. 1 through 7 show a first embodiment of the present invention. FIG. 1 is a schematic cross-sectional view of a semiconductor light emitting device.

As shown in FIG. 1, a semiconductor light emitting device 1 serving as a broadband infrared light emitting device includes: a pair of lead frames 2 and 3; an LED device 4 mounted on the lead frames 2 and 3; a first glass phosphor 51 serving as an sealant sealing the LED device 4; and a second glass phosphor 52 covering the first glass phosphor 51. The semiconductor light emitting device 1 is capable of emitting infrared light of from about 850 nm to 1220 nm. Because living bodies have a high transmittance in this wavelength range, the wavelength range is suitable for use as a light source in, for example, medical fields, vital observation fields, and the like. The wavelength range covers particularly a wavelength range of from 900 nm to 1000 nm, in which absorption spectra resulting from sugar, fat, water, and the like are present. Thus, this wavelength range is useful as a light source in agricultural and food fields.

The lead frames 2 and 3 made of a conductive metal have: rod-like portions 21 and 31, respectively, extending parallel to each other in a predetermined direction; mounting portions 22 and 32, respectively, which are formed on the top end sides of the rod-like portions 21 and 31 and on which the LED device 4 is mounted; and reflecting portions 23 and 33, respectively, formed on the top end sides of the rod-like portions 21 and 31 and surrounding the LED device 4. Here, descriptions are given on the assumption that the direction of the base end sides of the lead frames 2 and 3 is downward, and the direction of the top end sides is upward.

The base end sides of the rod-like portions 21 and 31 are connected to an external power source so that power is supplied to the LED device 4. The mounting portions 22 and 32 extend from the top end sides of the rod-like portions 21 and 31 in the directions of being in close vicinity to each other, respectively, and the mounting portions 22 and 32 are placed at a distance from each other to secure insulation. The upper surfaces of the mounting portions 22 and 32 are formed in a flat manner and have a circular shape in an integrated manner. The reflecting portions 23 and 33 extend upward from the top end sides of the rod-like portions 21 and 31, respectively, and reflect upward the light emitted from the LED device 4. The inner surfaces of the reflecting portions 23 and 33 are formed so as to be flared from the lower side to the upper side.

The LED device 4 includes a substrate 41, a semiconductor layer 42, and a p-electrode 43 and an n-electrode 44 that are connected to the semiconductor layer 42. The p-electrode 43 and the n-electrode 44 are electrically connected to the mounting portions 22 and 32, respectively. In the present embodiment, the LED device 4 is of a flip-chip type in which the p-electrode 43 and the n-electrode 44 are formed on the mounting surface. The LED device 4 is placed across the lead frames 2 and 3 such that the p-electrode 43 is connected to one of the lead frames, namely the lead frame 2, and the n-electrode 44 is connected to the other lead frame, namely the lead frame 3.

In the present embodiment, the substrate 41 is made of sapphire, and the semiconductor layer 42 is made of a semiconductor represented by a formula, $In_xAl_yGa_{1-x-y}N$ ($0 \leq x \leq 1$, $0 \leq y \leq 1$, $0 \leq x+y \leq 1$). The LED device 4 emits first excitation light $\lambda 1$ in a first wavelength range.

FIG. 2 is a graph showing emission spectrum of the LED device.

As shown in FIG. 2, in the present embodiment, the first wavelength range is from 380 nm to 440 nm, and the LED device 4 emits light having a peak wavelength near 405 nm and a half width of about 15 nm. Further, a shaded area of FIG. 2 indicates the excitation band of the first glass phosphor 51. In the present embodiment, the excitation band is from about 395 nm to 415 nm. As described above, the first glass phosphor 51 has an excitation band in the first wavelength range, and therefore, if the first excitation light $\lambda 1$ is incident thereon, emits fluorescence.

The first glass phosphor 51 seals the LED device 4, and fills the insides of the mounting portions 22 and 32 and the reflecting portions 23 and 33 of the lead frames 2 and 3. In the present embodiment, the first glass phosphor 51 is formed into a hemispherical shape such that the outer surface of the first glass phosphor 51 is convex upward. Further, the second glass phosphor 52 is formed with a uniform thickness over the entire outer surface of the first glass phosphor 51. In the present embodiment, the first glass phosphor 51 and the second glass phosphor 52 are in tight contact with each other such that the contact portions form an interface 53, and the outer surface of the second glass phosphor 52 forms a lens-shaped surface 54. It should be noted that a film made of a resin or the like may be formed on the outer surface of the second glass phosphor 52 in order to protect the second glass phosphor 52 or control light. In the present embodiment, the outside of the second glass phosphor 52 and the outsides of the lead frames 2 and 3 are formed so as to be flush with each other.

The first glass phosphor 51 and the second glass phosphor 52 each have a matrix made of glass, and an emission center included in the matrix. The term "emission center" is a structure present in a matrix material to produce emission, in which case, however, the matrix material constitutes substantially one material and therefore is different from a phosphor contained in an sealant made of a resin, a glass, or the like. That is, if a phosphor is contained in an sealant made of a resin, a glass, or the like, the contained phosphor and the sealant made of a resin, a glass, or the like are separate materials and therefore do not constitute one material.

In the present embodiment, the matrix of the first glass phosphor 51 is made of an $Sb_2O_3$—$B_2O_3$ glass, and the emission center is made of $Sm^{3+}$. If excited by the first excitation light $\lambda 1$ emitted from the LED device 4, the first glass phosphor 51 emits second excitation light $\lambda 2$ in a second wavelength range, first infrared light $\lambda 3$ in a third wavelength range, and third infrared light $\lambda 5$ in a fifth wavelength range.

FIGS. 3(a) and (b) are graphs showing the emission spectrum of the first glass phosphor having a thickness of 1.0 mm produced such that $Sm_2O_3$ is 1.1 mol %, $Bi_2O_3$ is 9.9 mol %, $B_2O_3$ is 44.6 mol %, and $Sb_2O_3$ is 44.4 mol %. Specifically, the emission spectrum was obtained from the emission intensity measured at an excitation wavelength of 405 nm.

As shown in FIG. 3(a), in the present embodiment, the second wavelength range is from 550 nm to 670 nm. Further, the second excitation light $\lambda 2$ has a first peak near 565 nm, a second peak near 590 nm, and a third peak near 640 nm, and the emission intensity is highest at the second peak.

As shown in FIG. 3(b), in the present embodiment, the third wavelength range is from 850 nm to 970 nm. The first infrared light $\lambda 3$ has a first peak near 900 nm and a second peak near 950 nm, and the emission intensity is highest at the second peak.

In addition, in the present embodiment, the fifth wavelength range is from 1100 nm to 1220 nm. The third infrared light $\lambda 5$ has a peak near 1180 nm. It should be noted that, as shown in FIG. 3(b), the first glass phosphor 51 also emits infrared light having a peak near 1030 nm between the first infrared light $\lambda 3$ and the third infrared light $\lambda 5$.

The first glass phosphor 51 is produced by mixing and melting an $Sm_2O_3$ powder, an $Sb_2O_3$ powder, an $H_3BO_3$ powder, and a $Bi_2O_3$ powder, and thereafter cooling the melted mixture. The melting temperature was 1000° C.

Figure 4:
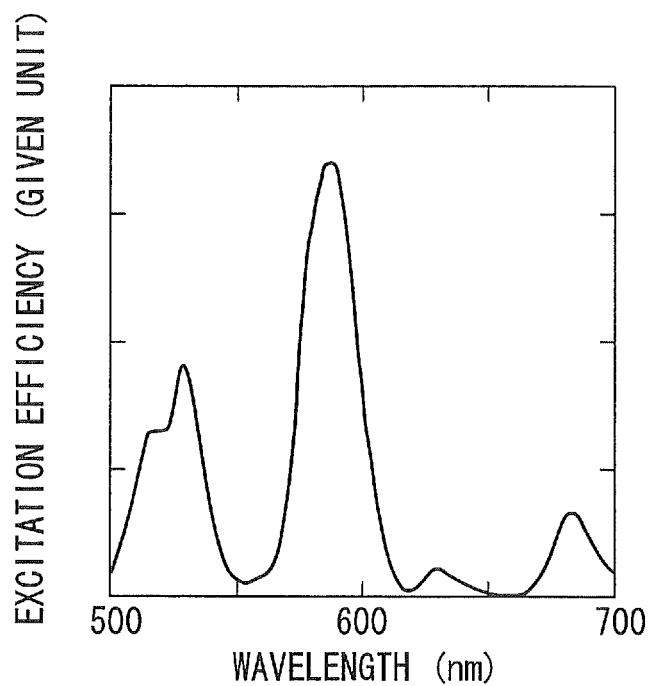
FIG. 4 is a graph showing the excitation spectrum of a second glass phosphor having a thickness of 1.0 mm produced such that $Yb_2O_3$ is 1.2 mol %, $Nd_2O_3$ is 1.1 mol %, $Bi_2O_3$ is 9.7 mol %, $B_2O_3$ is 44.1 mol %, and $Sb_2O_3$ is 43.9 mol %.

In addition, the matrix of the second glass phosphor 52 is made of an $Sb_2O_3$—$B_2O_3$ glass, and the emission center is made of $Yb^{3+}$ and $Nd^{3+}$. As shown in FIG. 4, the second glass phosphor 52 has an excitation band in the second wavelength range. Thus, when excited by the second excitation light $\lambda 2$ emitted from the first glass phosphor 51, the second glass phosphor 52 emits second infrared light $\lambda 4$ in a fourth wavelength range. Further, the second glass phosphor 52 does not have an excitation band in the third wavelength range. Thus, the first infrared light $\lambda 3$ emitted from the first glass phosphor 51 passes through the second glass phosphor 52.

FIG. 4 is a graph showing the excitation spectrum of the second glass phosphor having a thickness of 1.0 mm produced such that $Yb_2O_3$ is 1.2 mol %, $Nd_2O_3$ is 1.1 mol %, $Bi_2O_3$ is 9.7 mol %, $B_2O_3$ is 44.1 mol %, and $Sb_2O_3$ is 43.9 mol %. Specifically, the excitation spectrum was obtained from the emission intensity measured at an emission wavelength of 976 nm.

As shown in FIG. 4, the second glass phosphor 52 can be excited at from 500 nm to 700 nm. Thus, if the second wavelength range of the second excitation light $\lambda 2$ is from 500 nm to 700 nm, the second glass phosphor 52 can be excited. The excitation spectrum of the second glass phosphor 52 has a plurality of peaks, and has excellent excitation efficiencies particularly near 530 nm, near 585 nm, and near 685 nm.

Figure 5:
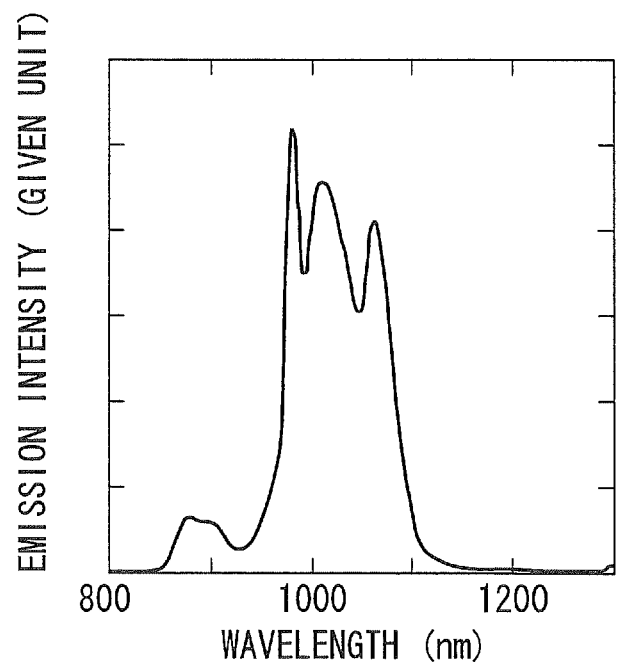
FIG. 5 is a graph showing the emission spectrum of the second glass phosphor having a thickness of 1.0 mm produced such that $Yb_2O_3$ is 1.2 mol %, $Nd_2O_3$ is 1.1 mol %, $Bi_2O_3$ is 9.7 mol %, $B_2O_3$ is 44.1 mol %, and $Sb_2O_3$ is 43.9 mol %.

FIG. 5 is a graph showing the emission spectrum of the second glass phosphor having a thickness of 1.0 mm produced such that $Yb_2O_3$ is 1.2 mol %, $Nd_2O_3$ is 1.1 mol %, $Bi_2O_3$ is 9.7 mol %, $B_2O_3$ is 44.1 mol %, and $Sb_2O_3$ is 43.9 mol %. Specifically, the emission spectrum was obtained from the emission intensity measured at an excitation wavelength of 590 nm.

As shown in FIG. 5, in the present embodiment, the fourth wavelength range is from 950 nm to 1070 nm. It should be noted that the emission intensity is small, but, technically, light is emitted even at 950 nm or less. The second infrared light $\lambda 4$ has a sharp emission peak near 978 nm, and on the longer wavelength side of this emission peak, has a relatively broad emission peak near 1006 nm. An emission peak of 1003 nm has a half width of about 100 nm.

The second glass phosphor 52 is produced by mixing and melting a $Yb_2O_3$ powder, an $Nd_2O_3$ powder, an $Sb_2O_3$ powder, an $H_3BO_3$ powder, and a $Bi_2O_3$ powder, and thereafter cooling the melted mixture. The melting temperature was 1000° C.

Next, a description is given for a method of manufacturing the semiconductor light emitting device 1. First, the LED device 4 is mounted on the lead frames 2 and 3. It should be noted that the lead frames 2 and 3 are produced by working metal, and the LED device 4 is produced by causing the GaN semiconductor layer 42 to epitaxially grow on the substrate 41 made of sapphire. Meanwhile, the first glass phosphor 51 in a softened state is produced by mixing and heating an $Sm_2O_3$ powder, an $Sb_2O_3$ powder, an $H_3BO_3$ powder, and a $Bi_2O_3$ powder. Then, the first glass phosphor 51 is placed, using a mold, at the top ends of the lead frames 2 and 3 on which the LED device 4 is mounted.

Simultaneously with this, the second glass phosphor 52 in a softened state is produced by mixing and heating a $Yb_2O_3$ powder, an $Nd_2O_3$ powder, an $Sb_2O_3$ powder, an $H_3BO_3$ powder, and a $Bi_2O_3$ powder. Then, the second glass phosphor 52 is placed on the first glass phosphor 51, using a mold, and the first and second glass phosphors 51 and 52 are cooled and molded. This completes the cannonball-shaped semiconductor light emitting device 1 in which the LED device 4 is sealed by the first and second glass phosphors 51 and 52 having the lens-shaped surface 54.

Here, the LED device 4 is flip-chip mounted, which makes it unlikely that the electrically connected regions of the LED device 4 and the lead frames 2, 3 are subjected to physical damage, thermal damage, or the like caused by the phosphors 51 and 52. Further, in the molding, it is desirable that the phosphors 51 and 52 should be molded while the LED device 4 is cooled.

Figure 6:
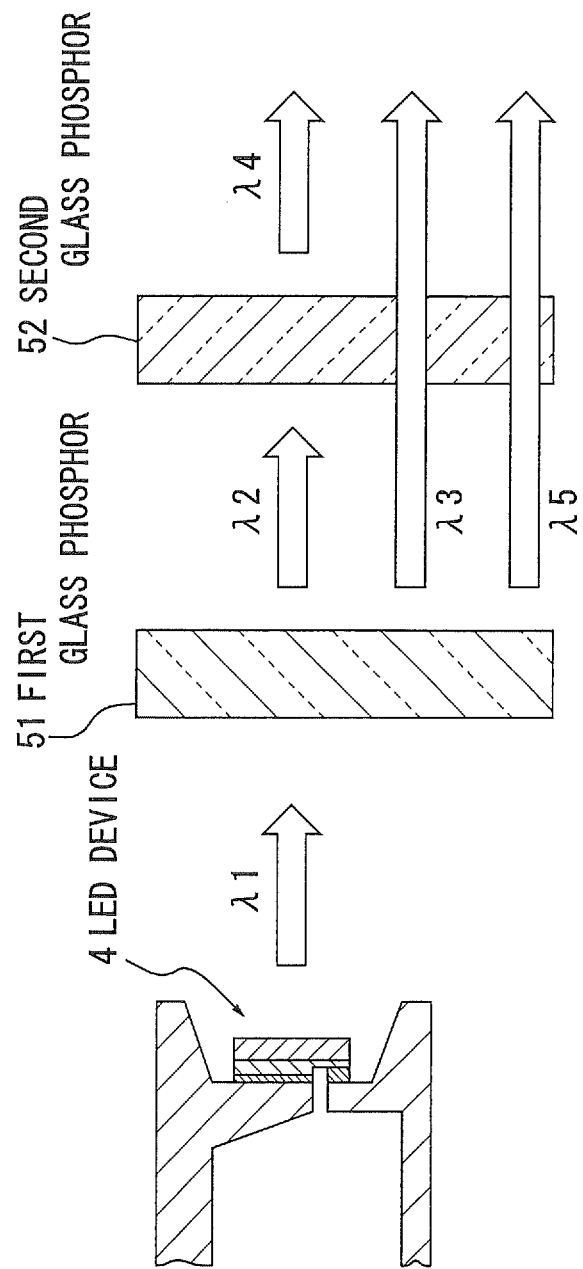
FIG. 6 is a diagram illustrating a wavelength conversion function of the semiconductor light emitting device.

In the semiconductor light emitting device 1 configured as described above, when voltage is applied to the lead frames 2 and 3, the blue first excitation light $\lambda 1$ is emitted from the LED device 4 as shown in FIG. 6. Here, FIG. 6 is a diagram illustrating a wavelength conversion function of the semiconductor light emitting device 1. It should be noted that FIG. 6 shows the LED device 4, the first glass phosphor 51, and the second glass phosphor 52 separately from each other for illustrative purposes. As shown in FIG. 6, when the first excitation light $\lambda 1$ from the LED device 4 serving as the light source is incident on the first glass phosphor 51, the first glass phosphor 51, excited by the first excitation light $\lambda 1$, emits light including the second excitation light $\lambda 2$, the first infrared light $\lambda 3$, and the third infrared light $\lambda 5$ which are yellow.

In addition, when the second excitation light $\lambda 2$, the first infrared light $\lambda 3$, and the third infrared light $\lambda 5$ are incident on the second glass phosphor 52, the first infrared light $\lambda 3$ and the third infrared light $\lambda 5$ pass through the second glass phosphor 52, and the second glass phosphor 52, excited by the second excitation light $\lambda 2$, emits the second infrared light $\lambda 4$. This causes the second glass phosphor 52 to radiate broadband infrared light including the first infrared light $\lambda 3$, the second infrared light $\lambda 4$, and the third infrared light $\lambda 5$ to the outside.

Figure 7:
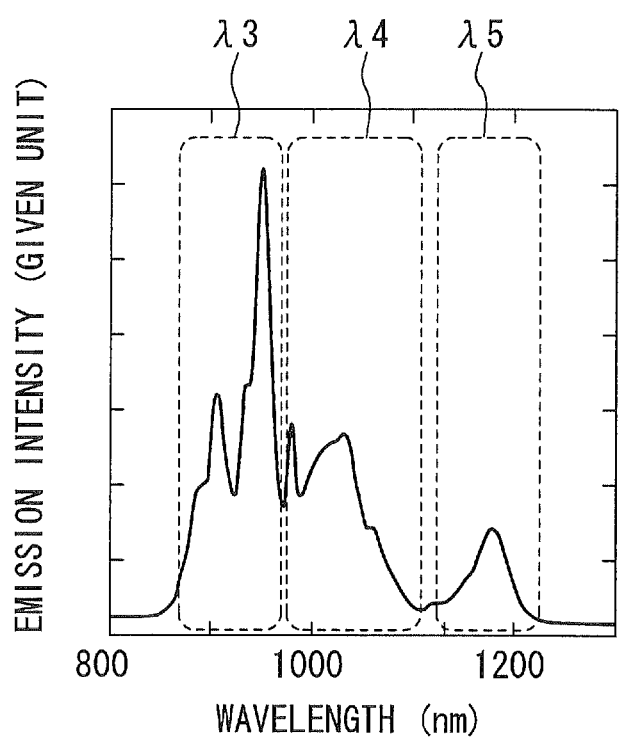
FIG. 7 is a graph showing emission spectrum of broadband infrared light radiated from the semiconductor light emitting device to the outside.

FIG. 7 is a graph showing the emission spectrum of the broadband infrared light radiated from the semiconductor light emitting device 1 to the outside. As shown in FIG. 7, the emission spectra of the first infrared light $\lambda 3$ and the third infrared light $\lambda 5$ resulting from the emission from the first glass phosphor 51 are present on the shorter wavelength side and the longer wavelength side, respectively, of the second infrared light $\lambda 4$ resulting from the emission from the second glass phosphor 52. This results in radiating infrared light having a broad band as a whole to the outside. It should be noted that it is possible to appropriately adjust the emission intensities of the infrared light $\lambda 3$, the infrared light $\lambda 4$, and the infrared light $\lambda 5$ by changing the concentrations of the rare earth ions serving as the emission centers, the thicknesses of the phosphors 51 and 52, or the like.

In addition, within each of the phosphors 51 and 52, the rare earth ion(s) serving as the emission center is uniformly included in the matrix glass. Thus, balanced wavelength conversion is performed within each of the phosphors 51 and 52.

That is, unlike a conventional light-emitting device in which a particle phosphor is contained in a transparent sealant, irregularities in color are not caused in accordance with the distribution of the particles in the sealant, and light is not reflected by the interface between the phosphor particles and the sealant. Then, the infrared light subjected to wavelength conversion by the phosphors 51 and 52 is collected by the lens-shaped surface 54 and radiated to the outside of the device.

In addition, on the basis of the semiconductor light emitting device 1 according to the present embodiment, $Sb_2O_3$—$B_2O_3$ glasses are used as glasses, and therefore, the phosphors 51 and 52 have relatively low melting points, which is advantageous for manufacturing the device. Further, because the glasses of the phosphors 51 and 52 are those of the same system, the refractive indices of the phosphors 51 and 52 are almost the same as each other, and therefore hardly change at the interface 53 between the phosphors 51 and 52. Thus, there are no effects of the reflection, the refraction, and the like of light at the interface 53, which facilitates optical control. Further, because the glass transition temperatures, the rates of thermal expansion, and the like of the phosphors 51 and 52 are also almost the same as each other, in the manufacturing of the device, cracks are not produced by the difference in coefficient of thermal expansion between the phosphors 51 and 52 when cooling is performed, which allows close contact between the phosphors 51 and 52 with accuracy.

It should be noted that, in the above embodiment, the emission center of the first glass phosphor 51 is an Sm ion, and the emission center of the second glass phosphor 52 is a Yb ion and an Nd ion. Alternatively, examples of each emission center may include rare earth ions such as Tm ions, Er ions, Dy ions, and Pr ions. Further, each emission center may be appropriately codoped with these rare earth ions, where appropriate. The rare earth ions are different from each other in excitation wavelength and emission wavelength, and therefore, a rare earth ion for the first glass phosphor and a rare earth ion for the second glass phosphor may be appropriately selected in accordance with the use of the semiconductor light emitting device 1.

In addition, in the above embodiment, the first glass phosphor 51 emits infrared rays on both the shorter wavelength side and the longer wavelength side of the second infrared light of the second glass phosphor 52. It, however, goes without saying that a phosphor that emits either one of the infrared rays can also achieve the second infrared light having a broader band. Further, the third wavelength range, the fourth wavelength range, and the fifth wavelength range do not need to be clearly distinguished from one another. For example, parts of the third wavelength range and the fourth wavelength range may overlap each other, or parts of the fourth wavelength range and the fifth wavelength range may overlap each other. Rather, it may be preferable if parts of adjacent wavelength ranges overlap each other, because this makes the emission intensities uniform. If the first infrared light, the second infrared light, and the third infrared light have peak wavelengths as in the above embodiment, it is only necessary that the peak wavelength of the first infrared light is shorter than the peak wavelength of the second infrared light, and the peak wavelength of the third infrared light is longer than the peak wavelength of the second infrared light.

In addition, the concentrations of the rare earth ions may be changed between the side closer to the LED device 4 (for example, a lower side of FIG. 1) and the side further from the LED device 4 (for example, an upper side of FIG. 1) in each of the phosphors 51 and 52. These are changes in the concentrations to be made intentionally, which is different from unintended irregularities in dispersion in conventional art. In this case, each of the phosphors 51 and 52 may be formed of a plurality of layers having rare earth ions different in concentration, starting from the LED device 4 side, or may be formed such that the concentrations of the rare earth ions continuously change with distance from the LED device 4. Alternatively, the types of rare earth ions may be changed in each of the phosphors 51 and 52.

In addition, a boric acid glass, namely an $Sb_2O_3$—$B_2O_3$ glass, is used as the matrix of each of the phosphors 51 and 52. Alternatively, a phosphoric acid glass or a fluoride glass may be used. Specifically, examples of the phosphoric acid glass or the fluoride glass may include low-melting-point glasses such as $Bi_2O_3$—$GeO_2$ glasses, ZnO—$B_2O_3$ glasses, CaO—$B_2O_3$ glasses, and CaO—$P_2O_5$ glasses. The glass of the matrix of each of the phosphors 51 and 52 preferably has a low melting point in order to seal the LED device 4. Further, it is desirable that the refractive index of the glass of the matrix of each of the phosphors 51 and 52 should coincide with the refractive index of the substrate 41 of the LED device 4. For example, in the above embodiment, the substrate 41 is sapphire having a refractive index of 1.8, and therefore, it is desirable to use a glass having a refractive index of 1.8 as the matrix of each of the phosphors 51 and 52. It should be noted that it is possible to change the refractive index of the glass by adjusting the amount of each oxide in the glass.

In addition, the first glass phosphor 51 and the second glass phosphor 52 may have matrices different in glass system. For example, if the first glass phosphor 51 uses glass having a relatively low melting point, and the second glass phosphor 52 uses a glass having a relatively high melting point, it is possible to mold the second glass phosphor 52 into a desired shape in advance, melt only the first glass phosphor 51, and seal the LED device 4 using the glass of the second glass phosphor 52 as a mold.

In addition, for example, if the first glass phosphor 51 uses a glass having a relatively high refractive index, and the second glass phosphor 52 uses a glass having a relatively low refractive index, the conditions of total reflection are not satisfied at the interface between the phosphors 51 and 52. Further, for example, even if the first glass phosphor 51 uses a glass having a relatively low refractive index, and the second glass phosphor 52 uses a glass having a relatively high refractive index, it is possible to increase the external radiation efficiency by selecting the refractive index of each of the phosphors 51 and 52.

In addition, with the light distribution characteristics of the LED device 4 taken into account, it is possible to appropriately change the concentrations of the rare earth ions or the compositions of the matrix glasses in order to achieve desired light distribution characteristics in the semiconductor light emitting device 1. For example, if the light distribution characteristics of the LED device 4 are asymmetrical with respect to a central axis of the device (an axis perpendicular to the light emitting surface of the device and passing through a center of the device), it is possible to design the concentrations of the rare earth ions and the refractive index of each of the phosphors 51 and 52 such that the light emitted from the semiconductor light emitting device 1 is symmetrical with respect to the central axis of the device. Alternatively, if the light distribution characteristics of the LED device 4 are symmetrical with respect to the central axis of the device, it is also possible to design the concentrations of the rare earth ions and the refractive index of each of the phosphors 51 and 52 such that the light emitted from the semiconductor light-emitting device 1 is asymmetrical with respect to the central axis of the device.

In addition, in the above embodiment, the lens-shaped surface 54 of the second glass phosphor 52 has a smooth curved shape. Alternatively, for example, the lens-shaped surface 54 may have the shape of a Fresnel lens in which the distance from the LED device 4 is approximately constant. Thus, it is possible to optionally change the lens-shaped surface 54.

Figure 8:
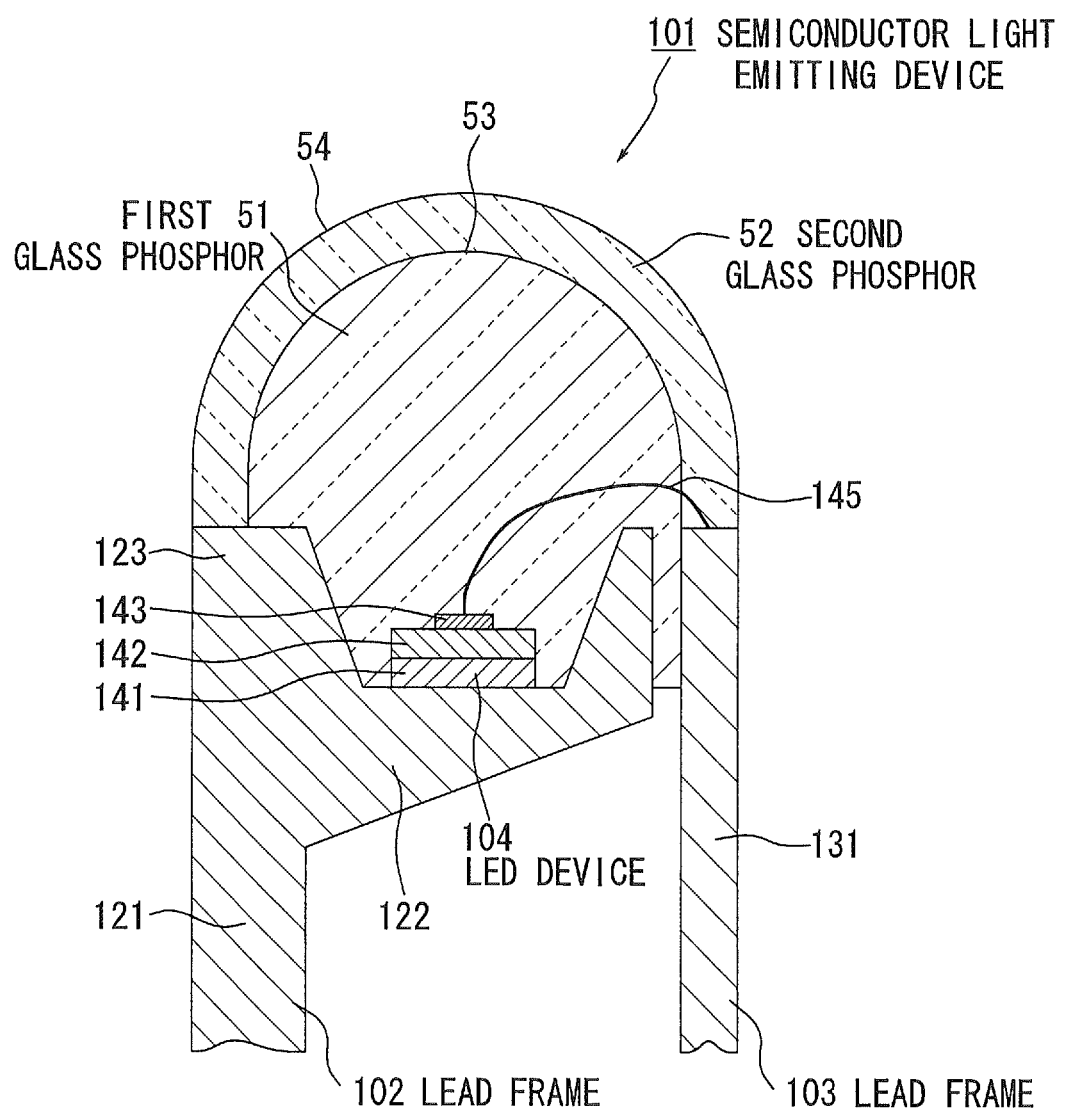
FIG. 8 is a schematic cross-sectional view of the semiconductor light emitting device showing a second embodiment of the present invention.

FIG. 8 shows a second embodiment of the present invention. FIG. 8 is a schematic cross-sectional view of a semiconductor light emitting device.

As shown in FIG. 8, a semiconductor light emitting device 101 includes: a pair of lead frames 102 and 103; an LED device 104 mounted on one of the lead frames, namely the lead frame 102; a first glass phosphor 51 serving as an sealant sealing the LED device 104; and a second glass phosphor 52 covering the first glass phosphor 51.

The lead frames 102 and 103 have rod-like portions 121 and 131, respectively, extending parallel to each other in a predetermined direction. One of the lead frames, namely the lead frame 102, has: a mounting portion 122 which is formed on the top end side of the rod-like portion 121 and on which the LED device 104 is mounted; and a reflecting portion 123 formed so as to protrude upward from the outer edge of the mounting portion 122 and surrounding the LED device 104.

The mounting portion 122 extends from the top end side of the rod-like portion 121 in the direction of being in close vicinity to the other lead frame, namely the lead frame 103, and the mounting portion 122 is placed at a distance from the other lead frame, namely the lead frame 103, to secure insulation. The upper surface of the mounting portion 122 is formed in a flat manner and has a circular shape. The reflecting portion 123 is formed so as to reflect upward the light emitted from the LED device 104, and the inner surface of the reflecting portion 123 is formed so as to be flared from the lower to the upper side.

In the LED device 104, a semiconductor layer 142 is formed on a substrate 141, and an electrode 143 formed on the semiconductor layer 142 is electrically connected to the other lead frame, namely the lead frame 103, by a wire 145. It should be noted that the substrate 141 of the LED device 104 is conductive so that the substrate 141 becomes electrically connected to one of the lead frames by making contact with the mounting portion 122. The emission spectrum of the LED device 104 is similar to that of the LED device 4 according to the first embodiment.

The first and second glass phosphors 51 and 52 seal the LED device 104, and fill the insides of the mounting portion 122 and the reflecting portion 123 of the lead frame 102. The outer surface of the second glass phosphor 52 forms a lens-shaped surface 54. In the present embodiment, the outside of the second glass phosphor 52 and the outsides of the lead frames 102 and 103 are formed so as to be flush with each other. The first glass phosphor 51 and the second glass phosphor 52 are similar to those according to the first embodiment, and therefore are not described in detail here.

Also in the semiconductor light emitting device 101 configured as described above, when voltage is applied to the lead frames 102 and 103, the second glass phosphor 52 radiates broadband infrared light including the first infrared light $\lambda 3$, the second infrared light $\lambda 4$, and the third infrared light $\lambda 5$ to the outside.

Figure 10:
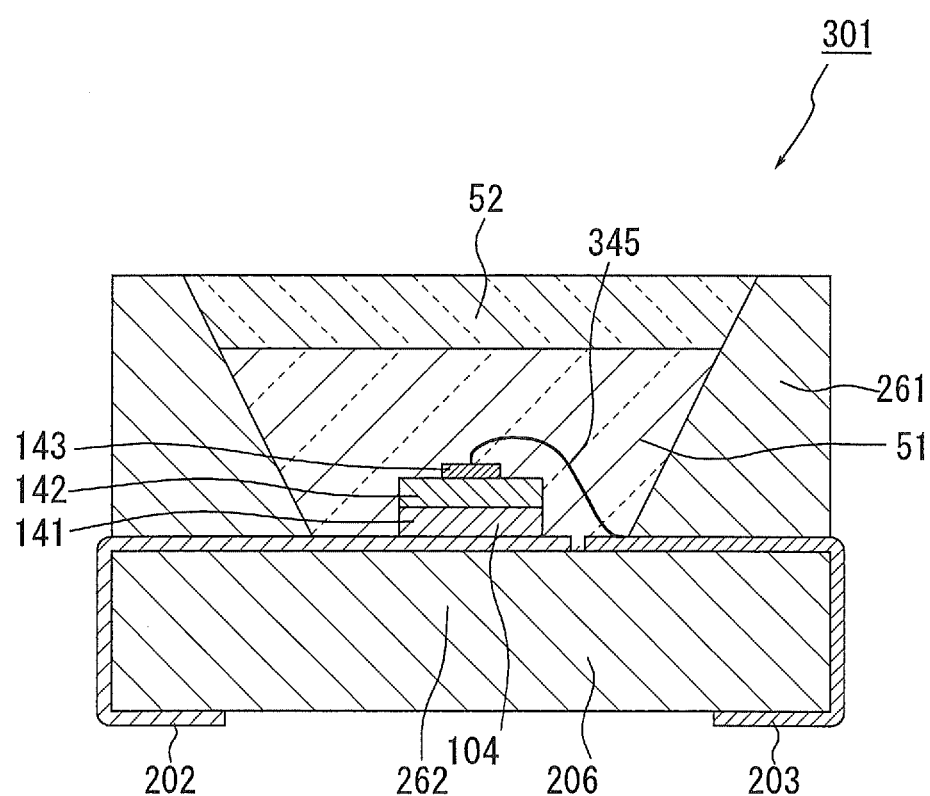
FIG. 10 is a schematic cross-sectional view of the semiconductor light emitting device, showing a variation.

It should be noted that, in each of the above embodiments, the semiconductor light emitting device has phosphors at the top ends of a pair of lead frames having rod-like portions. Alternatively, for example, as shown in FIGS. 9 and 10, the semiconductor light emitting device may be a surface-mount semiconductor light emitting device. Thus, it is possible to optionally change the form of the device.

In a semiconductor light emitting device 201 of FIG. 9, a depressed portion, open in its upper portion, is formed in a base 206 made of a ceramic, and an LED device 4 is flip-chip mounted in the depressed portion. In a bottom portion 262 of the base 206, metal patterns 202 and 203 made of metal are formed so as to supply power to the LED device 4. Further, the base 206 has a reflecting portion 261 surrounding the LED device 4. A first glass phosphor 51 and a second glass phosphor 52 fill the inside of the depressed portion of the base 206 in this order from the LED device 4 side. The LED device 4 and the phosphors 51 and 52 are the same as those according to the first embodiment. The upper surface of the second glass phosphor 52 is formed in a flat manner so as to be flush with the reflecting portion 261. The phosphors 51 and 52 in a softened state fill the inside of the depressed portion of the base 206.

In a semiconductor light emitting device 301 of FIG. 10, an LED device 104 is mounted in a depressed portion of a base 206. The LED device 104 is the same as that according to the second embodiment. An electrode 143 of the LED device 104 and a metal pattern 203 are electrically connected to each other by a wire 345. A first glass phosphor 51 and a second glass phosphor 52 fill the inside of the depressed portion of the base 206 in this order from the LED device 104 side. The phosphors 51 and 52 are the same as those according to the first embodiment. The phosphors 51 and 52 in a melted state fill the inside of the depressed portion of the base 206.

Figure 11:
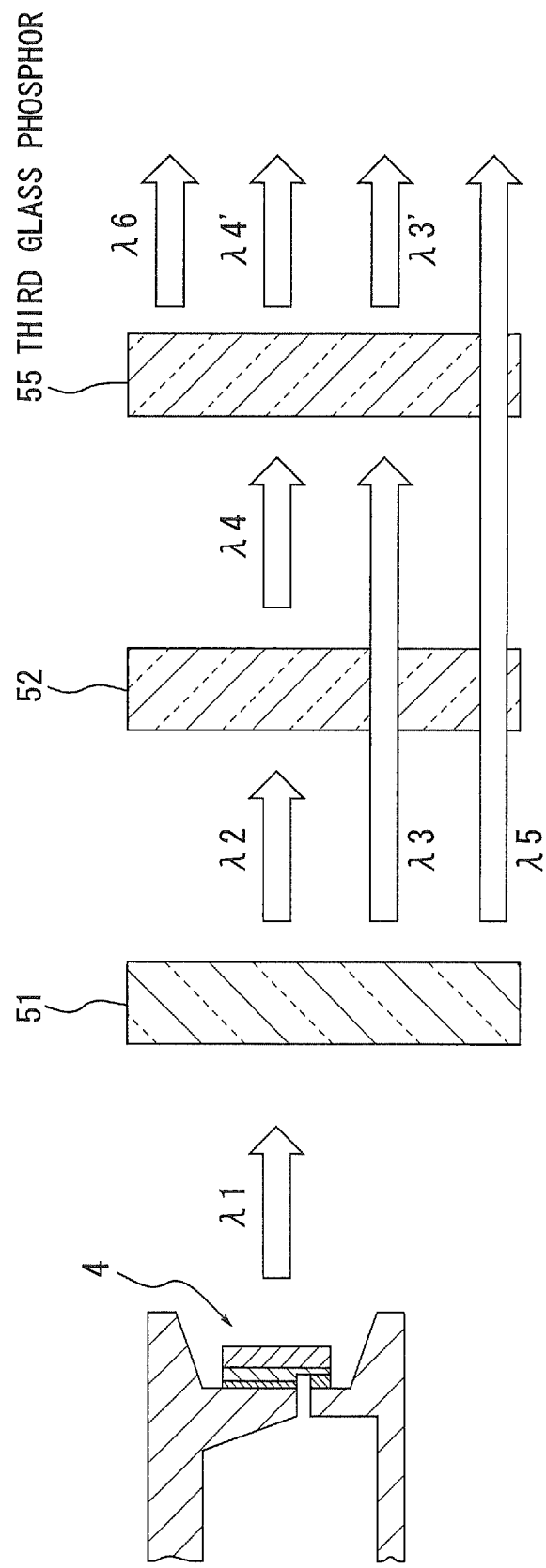
FIG. 11 is a diagram illustrating a wavelength conversion function of the semiconductor light emitting device, showing a variation.

In addition, in each of the above embodiments, two glass phosphors are used. Alternatively, for example, as shown in FIGS. 11 through 14, three or more glass phosphors may be used. FIG. 11 is a diagram illustrating a wavelength conversion function when three glass phosphors are used. In the variation of FIG. 11, a third glass phosphor 55 is used in addition to the first glass phosphor 51 and the second glass phosphor 52 according to each of the above embodiments. The first glass phosphor 51 and the second glass phosphor 52 are similar to those according to each of the above embodiments, and therefore are not described here.

The third glass phosphor 55 has a matrix made of a glass, and an emission center included in the matrix. The third glass phosphor 55 is placed on the emission side of the second glass phosphor 52, and when excited by the first infrared light $\lambda 3$ and the second infrared light $\lambda 4$, emits fourth infrared light $\lambda 6$ in a sixth wavelength range. It should be noted that the third glass phosphor 55 may be excited by either one of the first infrared light $\lambda 3$ and the second infrared light $\lambda 4$.

Specifically, the matrix of the third glass phosphor 55 is made of an $Sb_2O_3$—$B_2O_3$ glass, and the emission center is made of $Er^{3+}$. If excited by light near 980 nm, the third glass phosphor 55 emits light of from 1450 to 1630 nm. The third glass phosphor 55 is produced by mixing and melting an $Er_2O_3$ powder, an $Sb_2O_3$ powder, an $H_3BO_3$ powder, and a $Bi_2O_3$ powder, and thereafter cooling the melted mixture.

In the semiconductor light emitting device configured as described above, as shown in FIG. 11, when the first excitation light $\lambda 1$ from the LED device 4 is incident on the first glass phosphor 51, the first glass phosphor 51 emits light including the second excitation light $\lambda 2$, the first infrared light $\lambda 3$, and the third infrared light $\lambda 5$. Then, when the second excitation light $\lambda 2$, the first infrared light $\lambda 3$, and the third infrared light $\lambda 5$ are incident on the second glass phosphor 52, the first infrared light $\lambda 3$ and the third infrared light $\lambda 5$ pass through the second glass phosphor 52, and the second glass phosphor 52 emits the second infrared light $\lambda 4$.

When the first infrared light $\lambda 3$, the second infrared light $\lambda 4$, and the third infrared light $\lambda 5$ are incident on the third glass phosphor 55, the third infrared light $\lambda 5$ passes through the third glass phosphor 55. Further, the third glass phosphor 55 is excited by parts of the first infrared light $\lambda 3$ and the second infrared light $\lambda 4$, and the third glass phosphor 55 emits the fourth infrared light $\lambda 6$. Parts of the first infrared light $\lambda 3$ and the second infrared light $\lambda 4$ are absorbed in the third glass phosphor 55, and a first infrared light residual portion $\lambda 3'$ and a second infrared light residual portion $\lambda 4'$ pass through the third glass phosphor 55. This causes the third glass phosphor 55 to radiate broadband infrared light including the first infrared light residual portion $\lambda 3'$, the second infrared light residual portion $\lambda 4'$, the third infrared light $\lambda 5$, and the fourth infrared light $\lambda 6$. As described above, even if parts of the first infrared light $\lambda 3$ and the second infrared light $\lambda 4$ are absorbed in another phosphor or the like, it is only necessary that the broadband infrared light includes at least parts of the third wavelength range and the fourth wavelength range. Similarly, even if parts of the third infrared light $\lambda 5$ and the fourth infrared light $\lambda 6$ are absorbed in another phosphor or the like, it is also only necessary that the broadband infrared light includes at least parts of the fifth wavelength range and the sixth wavelength range.

Figure 12:
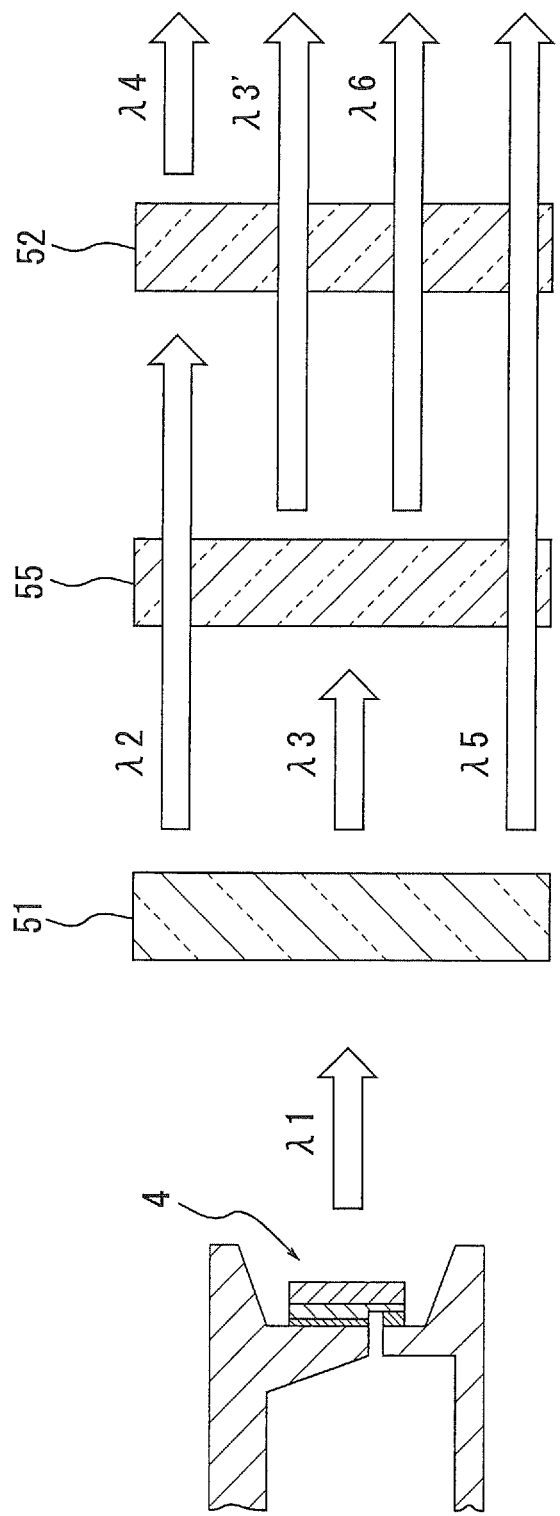
FIG. 12 is a diagram illustrating a wavelength conversion function of the semiconductor light emitting device, showing a variation.

In addition, as shown in FIG. 12, the third glass phosphor 55 may be placed between the first glass phosphor 51 and the second glass phosphor 52. Also in this case, as in FIG. 11, when the first excitation light $\lambda 1$ from the LED device 4 is incident on the first glass phosphor 51, the first glass phosphor 51 emits light including the second excitation light $\lambda 2$, the first infrared light $\lambda 3$, and the third infrared light $\lambda 5$. Then, when the second excitation light $\lambda 2$, the first infrared light $\lambda 3$, and the third infrared light $\lambda 5$ are incident on the third glass phosphor 55, the second excitation light $\lambda 2$ and the third infrared light $\lambda 5$ pass through the third glass phosphor 55. Further, the third glass phosphor 55 is excited by a part of the first infrared light $\lambda 3$, and the third glass phosphor 55 emits the fourth infrared light $\lambda 6$. A part of the first infrared light $\lambda 3$ is absorbed in the third glass phosphor 55, and the first infrared light residual portion $\lambda 3'$ passes through the third glass phosphor 55.

When the second excitation light $\lambda 2$, the first infrared light residual portion $\lambda 3'$, the third infrared light $\lambda 5$, and the fourth infrared light $\lambda 6$ are incident on the second glass phosphor 52, the first infrared light residual portion $\lambda 3'$, the third infrared light $\lambda 5$, and the fourth infrared light $\lambda 6$ pass through the second glass phosphor 52. Further, the second glass phosphor 52 is excited by the second excitation light $\lambda 2$, and the second glass phosphor 52 emits the second infrared light $\lambda 4$. This causes the second glass phosphor 52 to radiate broadband infrared light including the first infrared light residual portion $\lambda 3'$, the second infrared light $\lambda 4$, the third infrared light $\lambda 5$, and the fourth infrared light $\lambda 6$ to the outside.

In the arrangement as shown in FIG. 11, the third glass phosphor 55, which can be excited by the first infrared light $\lambda 3$ emitted from the first glass phosphor 51 and the second infrared light $\lambda 4$ emitted from the second glass phosphor 52, is located on the emission side. This makes it possible to make the emission intensity of the fourth infrared light $\lambda 6$ emitted from the third glass phosphor 55 relatively high. In the arrangement as shown in FIG. 12, the second glass phosphor 52 is located closer to the emission side than the third glass phosphor 55 is. This makes it possible to cover the excitation band of the third glass phosphor 55, using the second infrared light $\lambda 4$ emitted from the second glass phosphor 52.

FIGS. 13 and 14 are schematic cross-sectional views of semiconductor light emitting devices when three glass phosphors are used. In a semiconductor light emitting device 201 of FIG. 13, a depressed portion, open in its upper portion, is formed in a base 206, and an LED device 4 is flip-chip mounted in the depressed portion. In a bottom portion 262 of the base 206, metal patterns 202 and 203 are formed, and the base 206 has a reflecting portion 261 surrounding the LED device 4. A first glass phosphor 51, a third glass phosphor 55, and a second glass phosphor 52 fill the inside of the depressed portion of the base 206 in this order from the LED device 4 side. The phosphors 51, 52, and 55 in a softened state fill the inside of the depressed portion of the base 206.

In a semiconductor light emitting device 301 of FIG. 14, an LED device 104 is mounted in a depressed portion of a base 206. An electrode 143 of the LED device 104 and a metal pattern 203 are electrically connected to each other by a wire 345. A first glass phosphor 51, a third glass phosphor 55, and a second glass phosphor 52 fill the inside of the depressed portion of the base 206 in this order from the LED device 104 side. The phosphors 51, 52, and 55 in a melted state fill the inside of the depressed portion of the base 206.

In addition, in each of the above embodiments, an LED device is used as the semiconductor light emitting device. Alternatively, for example, another semiconductor light emitting device such as an LD device may be used. Further, the semiconductor light emitting device serving as the light source is sealed by the first glass phosphor. Alternatively, the first glass phosphor and the light source may be placed separately from each other. Furthermore, the first glass phosphor and the second glass phosphor are in close contact with each other. Alternatively, the first glass phosphor and the second glass phosphor may be placed separately from each other. Further, three glass phosphors are used as variations. Alternatively, it is possible to further increase glass phosphors, and it is also possible to appropriately change specific detailed configurations.

REFERENCE SIGNS LIST 1 semiconductor light emitting device
2 lead frame
3 lead frame
4 LED device
21 rod-like portion
22 mounting portion
23 reflecting portion
31 rod-like portion
32 mounting portion
33 reflecting portion
41 substrate
42 semiconductor layer
43 p-electrode
44 n-electrode
51 first glass phosphor
52 second glass phosphor
53 interface
54 lens-shaped surface
55 third glass phosphor
101 semiconductor light emitting device
102 lead frame
103 lead frame
104 LED device
121 rod-like portion
122 mounting portion
123 reflecting portion
141 substrate
142 semiconductor layer
143 p-electrode
145 wire
201 semiconductor light emitting device
202 metal pattern
203 metal pattern
206 base
261 reflecting portion
262 bottom portion
301 semiconductor light emitting device
345 wire

The invention claimed is:

1. A broadband infrared light emitting device, at least comprising:
    a light source that emits first excitation light in a first wavelength range;
    a first glass phosphor that has an excitation band in the first wavelength range, and when the first excitation light is incident thereon, emits second excitation light in a second wavelength range and first infrared light in a third wavelength rage; and
    a second glass phosphor that has an excitation band in the second wavelength range and does not have an excitation band in the third wavelength range, and when the second excitation light is incident thereon, allows the first infrared light to pass therethrough and emits second infrared light tin a fourth wavelength range,
    wherein at least one rare earth ion as an emission center is uniformly included in a matrix glass within the first glass phosphor an the second glass phosphor,
    wherein the broadband infrared light emitting device radiates broadband infrared light including at least a part of the third wavelength range and at least a part of the fourth wavelength range to an outside of the broadband infrared light,
    wherein the third wavelength range is shorter than the fourth wavelength,
    wherein the first glass phosphor, when the first excitation light is incident thereon, emits third infrared light in a fifth wavelength range that is longer than the fourth wavelength range,
    wherein the second glass phosphor does not have an excitation band in the fifth wavelength range,
    wherein the broadband infrared light includes at least a part of the third wavelength range, at least a part of the fourth wavelength range, and at least a part of the fifth wavelength range,
    wherein the at least one rare earth ion of the first glass phosphor comprises an Sm ion, and
    wherein the at least one rare earth ion of the second glass phosphor comprises a Yb ion and an Nd ion, and
    wherein the matrix glass of each of the first and second glass phosphors consists essentially of $Sb_2O_3$—$B_2O_3$ glass.

2. The broadband infrared light emitting device according to claim 1, wherein the first wavelength range is from 380 nm to 440 nm,
    wherein the second wavelength range is from 550 nm to 670 nm,
    wherein the third wavelength range is from 850 nm to 970 nm,
    wherein the fourth wavelength range is from 950 nm to 1070 nm, and
    wherein the fifth wavelength range is from 1100 nm to 1220 nm.

3. The broadband infrared light emitting device according to claim 2, further comprising:
    a third glass phosphor that has an excitation band in a predetermined wavelength range, and when predetermined excitation light is incident thereon, emits fourth infrared light in a sixth wavelength range, wherein at least one rare earth ion as an emission center is uniformly included in a matrix glass within the third glass phosphor, and wherein the broadband infrared light includes at least a part of the third wavelength range, at least a part of the fourth wavelength range, and at least a part of the sixth wavelength range.

4. The broadband infrared light emitting device according to claim 3, wherein the predetermined wavelength range is at least a part of at least one of the second wavelength range, the third wavelength range, the fourth wavelength range, and the fifth wavelength range.

5. The broadband infrared light emitting device according to claim 4, wherein the one rare earth ion of the third glass phosphor comprises an Er ion.

6. The broadband infrared light emitting device according to claim 5, wherein the sixth wavelength range is from 1450 nm to 1630 nm.

7. A broadband infrared light emitting device, at least comprising:

a light source that emits first excitation light in a first wavelength range;

a first glass phosphor that has an excitation band in the first wavelength range, and when the first excitation light is incident thereon, emits second excitation light in a second wavelength range and first infrared light in a third wavelength range; and a second glass phosphor that has an excitation band in the second wavelength range and does not have an excitation band in the third wavelength range, and when the second excitation light is incident thereon, allows the first infrared light to pass therethrough and emits second infrared light in a fourth wavelength range, wherein at least one rare earth ion as an emission center is uniformly included in a matrix glass within the first glass phosphor and the second glass phosphor, wherein the broadband infrared light emitting device radiates broadband infrared light including at least a part of the third wavelength range and at least a part of the fourth wavelength range to an outside of the broadband infrared light, wherein the first glass phosphor seals the semiconductor light emitting device, wherein the second glass phosphor covers the first glass phosphor, wherein matrices of the first glass phosphor and the second glass phosphor comprise glasses of the same system, and wherein the matrices of the phosphors are made of $Sb_2O_3$—$B_2O_3$ glasses.

8. A broadband infrared light emitting device, at least comprising:

a light source that emits first excitation light in a first wavelength range;

a first glass phosphor that has an excitation band in the first wavelength range, and when the first excitation light is incident thereon, emits second excitation light in a second wavelength range and first infrared light in a third wavelength range; and a second glass phosphor that has an excitation band in the second wavelength range and does not have an excitation band in the third wavelength range, and when the second excitation light is incident thereon, allows the first infrared light to pass therethrough and emits second infrared light in a fourth wavelength range, wherein at least one rare earth ion as an emission center is uniformly included in a matrix glass within the first glass phosphor and the second glass phosphor, wherein the broadband infrared light emitting device radiates broadband infrared light including at least a part of the third wavelength range and at least a part of the fourth wavelength range to an outside of the broadband infrared light, and wherein the matrix glass of each of the first and second glass phosphors comprises an $Sb_2O_3$—$B_2O_3$ glass.

* * * * *